(12) United States Patent
Wayman

(10) Patent No.: US 7,301,756 B2
(45) Date of Patent: Nov. 27, 2007

(54) SYSTEM FOR MOUNTING MODULES IN A RACK MOUNTED CHASSIS

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/388,088

(22) Filed: Mar. 23, 2006

(65) Prior Publication Data

US 2007/0223181 A1    Sep. 27, 2007

(51) Int. Cl.
*H05K 7/00* (2006.01)
(52) U.S. Cl. .................................. 361/679; 361/727
(58) Field of Classification Search ............ 312/265.1, 312/265.4, 334.4, 334.5, 223.1; 248/343; 361/679, 727
See application file for complete search history.

(56) References Cited

U.S. PATENT DOCUMENTS

| | | | | |
|---|---|---|---|---|
| 5,339,493 A | * | 8/1994 | MacIntyre | ................... 16/238 |
| 7,055,701 B2 | * | 6/2006 | Dean et al. | ................... 211/26 |
| 2001/0037985 A1 | * | 11/2001 | Varghese et al. | .............. 211/26 |

* cited by examiner

*Primary Examiner*—Jayprakash Gandhi
*Assistant Examiner*—Ingrid Wright
(74) *Attorney, Agent, or Firm*—Fogg & Powers LLC

(57) ABSTRACT

A mounted electronics system is provided. The mounted electronics system comprises at least one sub-module, a chassis adapted to receive the at least one sub-module, and a mounting assembly coupled to the chassis and adapted to secure the at least one sub-module to the chassis such that substantially all of the interior width of the chassis is available for use by the at least one sub-module.

19 Claims, 6 Drawing Sheets

SYSTEM FOR MOUNTING MODULES IN A RACK MOUNTED CHASSIS

BACKGROUND

Various electronic modules are often mounted in a rack or cabinet. Some standard racks and cabinets include the 19-inch rack, the 23-inch rack and the 600 mm cabinet. In certain situations, smaller printed circuit boards and sub-modules need to be mounted in a rack or cabinet. Often it is not practical or even possible to mount multiple sub-modules individually to the rack or cabinet. In these circumstances, it is common to use a chassis instead. The sub-modules are mounted to the chassis and the chassis is mounted to the rack or cabinet.

However, the sub-modules often cannot simply be placed in the chassis but need to be mounted or secured. Securing the sub-modules to the chassis prevents the sub-modules from falling out of the chassis and provides pressure to help maintain connections in the back of the chassis. Hence, using a chassis adds a limitation to the amount of space available for sub-modules. This space limitation is caused by the need for space to mount the chassis to the rack or cabinet and the additional space needed to mount the sub-modules to the chassis. This space limitation can become a problem when designing modular equipment to fit in a rack or cabinet.

For the reasons stated above, and for other reasons stated below which will become apparent to those skilled in the art upon reading and understanding the present specification, there is a need in the art for a system to mount sub-modules in a chassis without the space limitations of a typical chassis.

SUMMARY

The above-mentioned problems and other problems are resolved by the present invention and will be understood by reading and studying the following specification.

In one embodiment, a mounted electronics system is provided. The mounted electronics system comprises at least one sub-module, a chassis adapted to receive the at least one sub-module, and a mounting assembly coupled to the chassis and adapted to secure the at least one sub-module to the chassis such that substantially all of the interior width of the chassis is available for use by the at least one sub-module.

In another embodiment, a chassis mounting assembly is provided. The chassis mounting assembly comprises at least one joint coupled to a chassis, and a flange coupled to the at least one joint and adapted to secure at least one sub-module to the chassis, wherein the flange is positioned such that substantially the entire interior width of the chassis is available for use by the at least one sub-module.

In another embodiment, a method of inserting a sub-module into a chassis is provided. The method comprises rotating a flange coupled to a chassis toward the chassis interior; attaching the chassis to a frame; rotating the flange away from the interior of the chassis, wherein the flange is rotated such that the flange does not prevent a sub-module from occupying substantially the entire interior width of the chassis; inserting the sub-module into the chassis; and attaching the sub-module to the flange.

DRAWINGS

The present invention can be more easily understood and further advantages and uses thereof more readily apparent, when considered in view of the description of the preferred embodiments and the following figures in which.

Like reference numbers and designations in the various drawings indicate like elements

DETAILED DESCRIPTION

Figure 1:
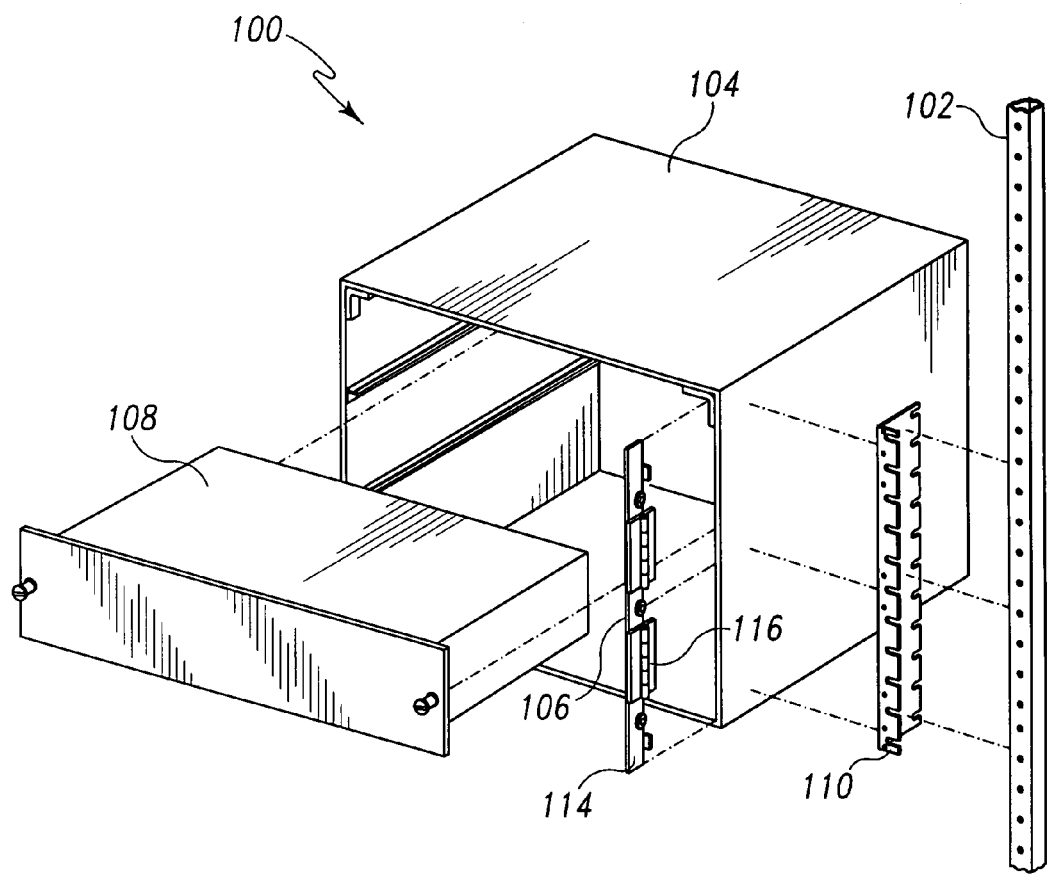
FIG. 1 is an isometric diagram of a mounted electronics system according to one embodiment of the present invention.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. It should be understood that the exemplary method illustrated may include additional or fewer steps or may be performed in the context of a larger processing scheme. Furthermore, the method presented in the drawing figures or the specification is not to be construed as limiting the order in which the individual steps may be performed. The following detailed description is, therefore, not to be taken in a limiting sense.

FIG. 1 is an exploded isometric diagram of a mounted electronics system 100 according to one embodiment of the present invention. For this example embodiment, system 100 includes a frame 102, a chassis 104, a bracket 110, a mounting assembly 106 and a sub-module 108. For purposes of explanation only, frame 102, mounting assembly 106 and bracket 110 are only shown on one side of chassis 104. However, it is to be understood that in operation a corresponding frame 102, mounting assembly 106 and bracket 110 are used on both the left and right sides of chassis 104. Chassis 104 is made of any appropriate material for housing electrical sub-modules and circuitry, such as steel, stainless steel and aluminum. Notably, although only 1 sub-module is shown in FIG. 1, the present invention is not intended to be so limited and any appropriate number of sub-modules is used in other embodiments. Additionally, the term frame as used herein (e.g. frame 102) refers to one of a 19-inch rack, 23-inch rack, 600 mm cabinet and any other size racks and cabinets. Chassis 104 is adapted to fit within the size limitations of frame 102.

Bracket 110 is coupled to chassis 104 and secures chassis 104 to frame 102. Mounting assembly 106 is also coupled to chassis 104 and secures sub-module 108 to chassis 104. Mounting assembly 106 is adapted to secure sub-module 108 to chassis 104 such that substantially all of the interior width of chassis 104 is available for use by sub-module 108. This enables a significant advantage over prior mounting systems which require a portion of the interior width of chassis 104 for mounting sub-module to the chassis. The benefits enabled by embodiments of mounting assembly 106 include increased interior space in chassis 104 for sub-module 108, increased space for the front panel of sub-module 108, and the possibility of covering part of frame 102 with the front panel of sub-module 108 which improves the aesthetic appearance of system 100. Increased space for the front panel of sub-module 108 is particularly important in embodiments using European cabinets, such as a 600 mm cabinet, which place all connectors on the front panel rather than allowing connectors in the back as in a North American 19-inch or 23-inch rack.

In operation, a flange 114 of mounting assembly 106 rotates about joint 116 toward the interior of chassis 104. In this position, bracket 110 is accessible in order to secure chassis 104 to frame 102 using bracket 110. Once chassis 104 is secured to frame 102, flange 114 of mounting assembly 106 rotates about joint 116 outward away from the interior of chassis 104 until substantially parallel with and overlapping bracket 110 with a small gap between bracket 110 and mounting assembly 106. In this position, sub-module 108 is attached to flange 114 of mounting assembly 106. This enables the benefit of not utilizing interior space in chassis 104 for mounting sub-module 108.

Figure 2:
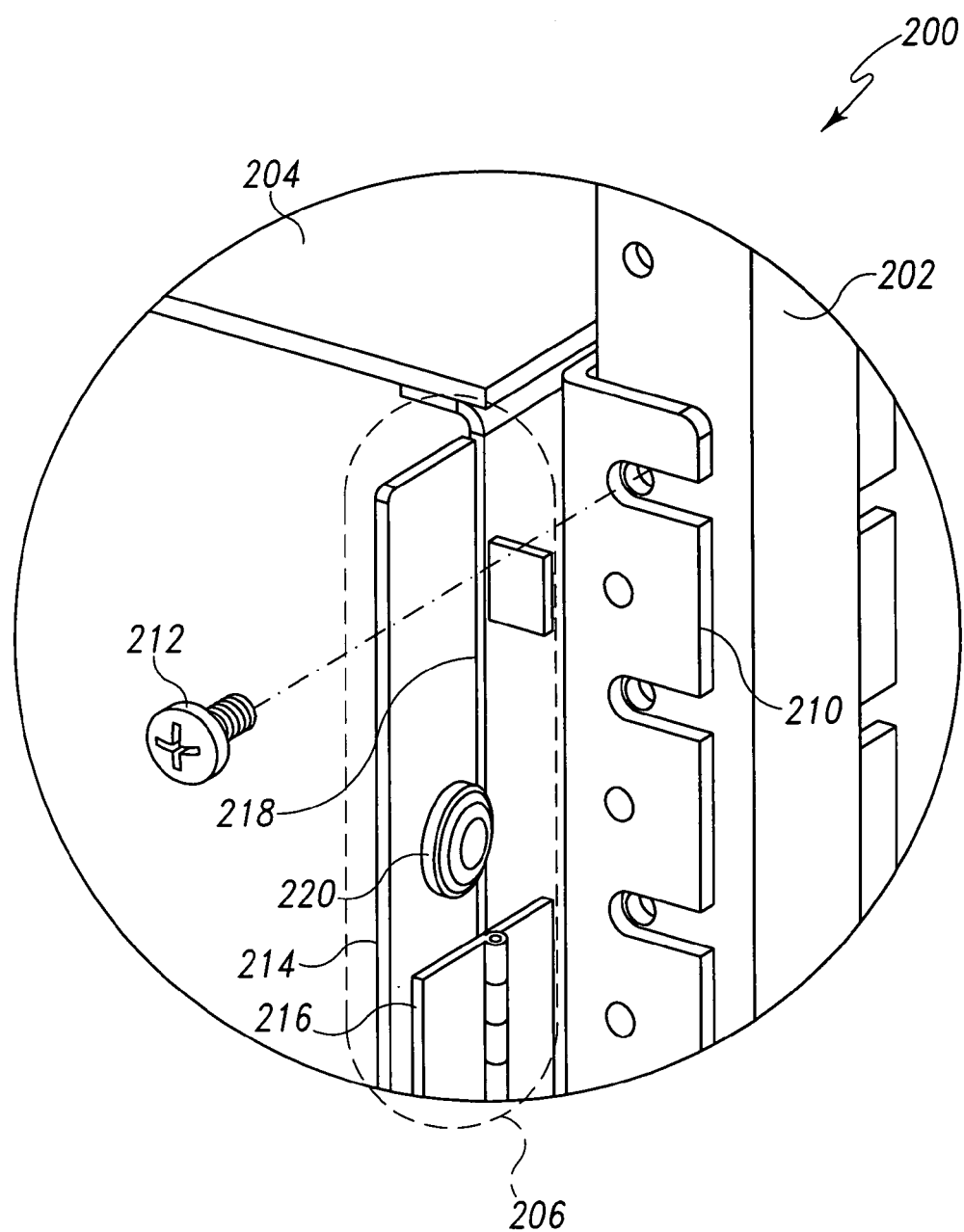
FIG. 2 is an enhanced view of a section of a mounted electronics system according to one embodiment of the present invention.

FIG. 2 is an enhanced view of a section of a mounted electronics system 200 according to one embodiment of the present invention. In particular, FIG. 2 shows a closer view of a mounting assembly 206 which can be used to implement mounting assembly 106 shown in FIG. 1. In this example embodiment, mounting assembly 206 includes flange 214, joint 216, screw hole 220, and stopper 218. In FIG. 2, flange 214 of mounting assembly 206 is rotated towards the interior of chassis 204 to enable access to bracket 210. Mounting assembly 206 is coupled to chassis 204 via joint 216 in this embodiment. Joint 216 is adapted to enable flange 214 to rotate enabling access to bracket 210 when securing chassis 204 to frame 202. In this example, joint 216 is implemented as a hinge. In other embodiments, other flexible joints are used, such as a ball-and-socket joint and solid flexible materials which do not have moving parts. Screw hole 220 is adapted to receive a screw for securing a sub-module to chassis 204 via flange 214. In some embodiments, a thumb-screw is used. However, it will be understood by one of skill in the art that any other appropriate securing means can be used in other embodiments, such as other threaded screws, nuts and bolts, mechanical latches, and clamps. Additionally, joint 216 is coupled to chassis 204 and flange 214 using screws in one example embodiment. In other embodiments, other means are used for coupling joint 216 to chassis 204 and flange 214 such as adhesive materials and slots in chassis 204 and flange 214 into which joint 216 is slid.

For this example embodiment, mounting assembly 206 also includes stopper 218 which is adapted to prevent flange 214 from rotating away from the interior of chassis 204 beyond a set point. In particular, stopper 218 maintains flange 214 substantially parallel with and overlapping bracket 210 even when force is applied to flange 214 while securing a sub-module to flange 214. In the embodiment shown in FIG. 2, stopper 218 is implemented as a section of metal formed in one side of chassis 204. However, in other embodiments, stopper 218 is a separate piece of material coupled to chassis 204 with screws, adhesive, or the like. Additionally, in some embodiments, joint 216 is adapted to provide the function of stopper 218. That is to say, in some embodiments, joint 216 is adapted to prevent flange 214 from over-rotating to maintain flange 214 substantially parallel with bracket 210 when securing sub-modules to flange 214.

In operation, flange 214 rotates about joint 216 towards the interior of chassis 204. This enables access to frame 202 and bracket 210. Screw 212 is then used to secure bracket 210 to frame 202. By securing bracket 210 to frame 202, chassis 204 is secured to frame 202 since bracket 210 is coupled to chassis 204. Once chassis 204 is secured to frame 202 via bracket 210, flange 214 rotates away from the interior of chassis 204 about joint 216 until flange 214 comes into contact with stopper 218. Stopper 218 provides support to flange 214 while sub-modules are secured to flange 214. By securing sub-modules to flange 214, the sub-modules are secured to chassis 204 since flange 214 is coupled to chassis 204 via joint 216.

Although the example embodiment in FIG. 2 describes a configuration where flange 214 is rotated away from the interior of chassis 204 and overlapping bracket 210 when sub-modules are secured to chassis 204 via flange 214, it is to be understood that other configurations are used in other embodiments. For example, in another exemplary embodiment, flange 214 is positioned substantially parallel to the side of chassis 204 to which flange 214 is coupled (as shown in FIG. 2) when securing sub-modules to flange 214 as well as when securing chassis 204 to frame 202 via bracket 210. Once inserted into chassis 204, the sub-modules are then secured to flange 214 using securing mechanisms such as screws or clamps. In this alternative embodiment, substantially all of the interior width of chassis 204 is still available for use by sub-module 208 and access to bracket 210 is still enabled as in the first exemplary embodiment described above with regards to FIG. 2. Additionally, in one such alternative embodiment, joint 216 is a non-flexible joint.

Figure 3:
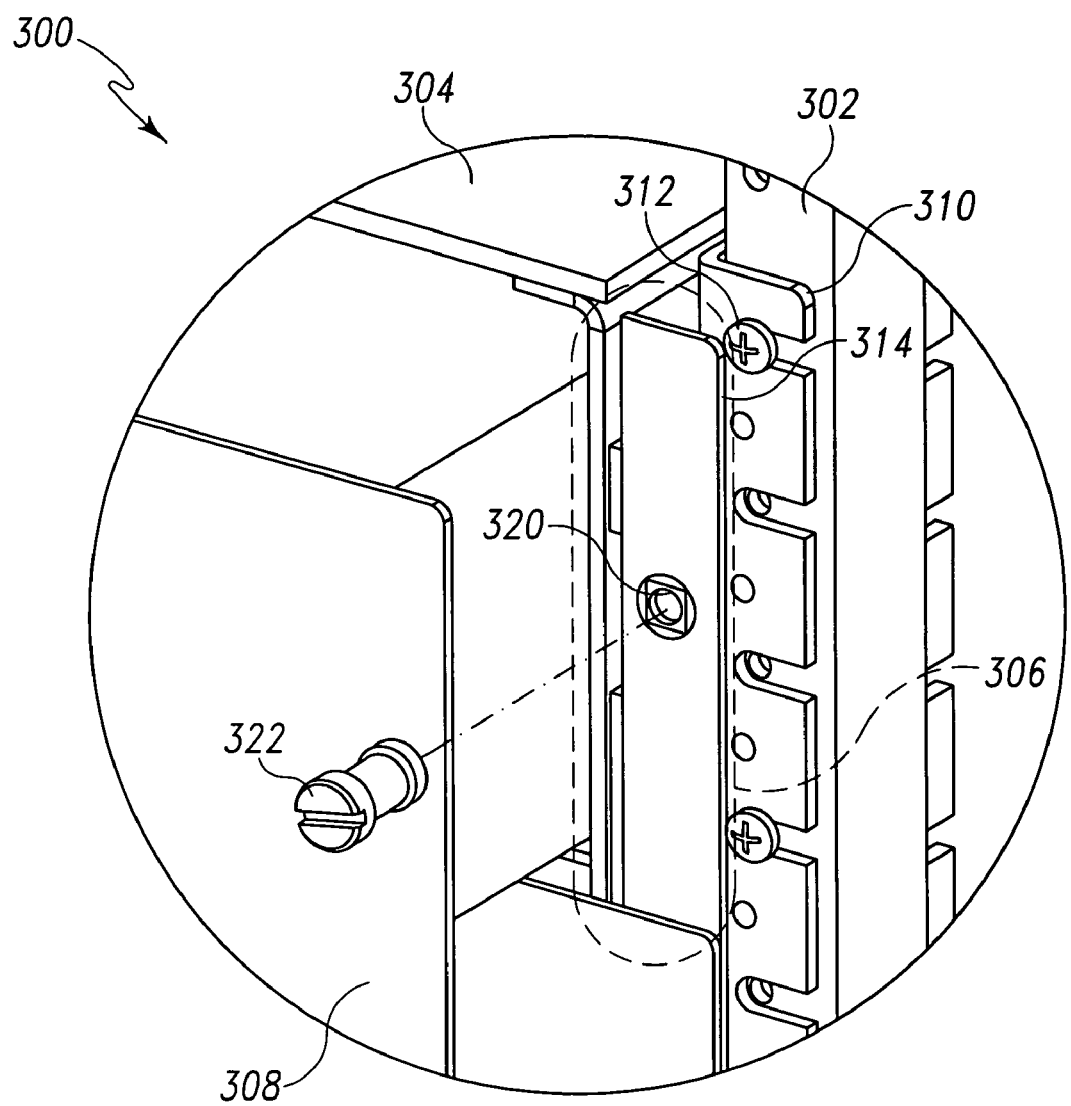
FIG. 3 is an enhanced view of a section of a mounted electronics system according to one embodiment of the present invention.

FIG. 3 is an enhanced view of a section of a mounted electronics system 300 according to one embodiment of the present invention. In particular, FIG. 3 shows a closer view of a mounting assembly 306 which can be used to implement mounting assembly 106 shown in FIG. 1. Mounting assembly 306 includes flange 314 and screw hole 320. In FIG. 3, mounting assembly 306 is rotated away from the interior of chassis 304 in order to secure sub-module 308 to chassis 304 via mounting assembly 306. Bracket 310 and screw 312 secure chassis 304 to frame 302 in FIG. 3. Mounting assembly 306 rotates about a joint (such as joint 216 in FIG. 2) away from the interior of chassis 304 until substantially parallel with and overlapping bracket 310 as can be seen in FIG. 3. When in this position, screw 322 secures sub-module 308 to flange 314 via screw hole 320. As can be seen in FIG. 3, substantially no interior space of chassis 304 has been wasted by mounting assembly 306 in the process of securing sub-module 308 to chassis 304.

Although the example embodiment in FIG. 3 describes a configuration where flange 314 is overlapping bracket 310 when sub-module 308 is secured to flange 314, it is to be understood that other configurations are used in other embodiments. For example, in another exemplary embodiment, flange 314 is rotated to overlap sub-module 308 once sub-module 308 is inserted into chassis 304. In such an embodiment, the width of sub-module 308 is substantially equal to or less than the width of chassis 304. Sub-module 308 is inserted into chassis 304 and then flange 314 is rotated to overlap sub-module 308. Sub-module 308 is then secured to flange 314 with screw 322. In this alternative embodiment, substantially all of the interior width of chassis 304 is still available for use by sub-module 308 and access to bracket 310 is still enabled as in the first exemplary embodiment described above with regards to FIG. 3.

Figure 4:
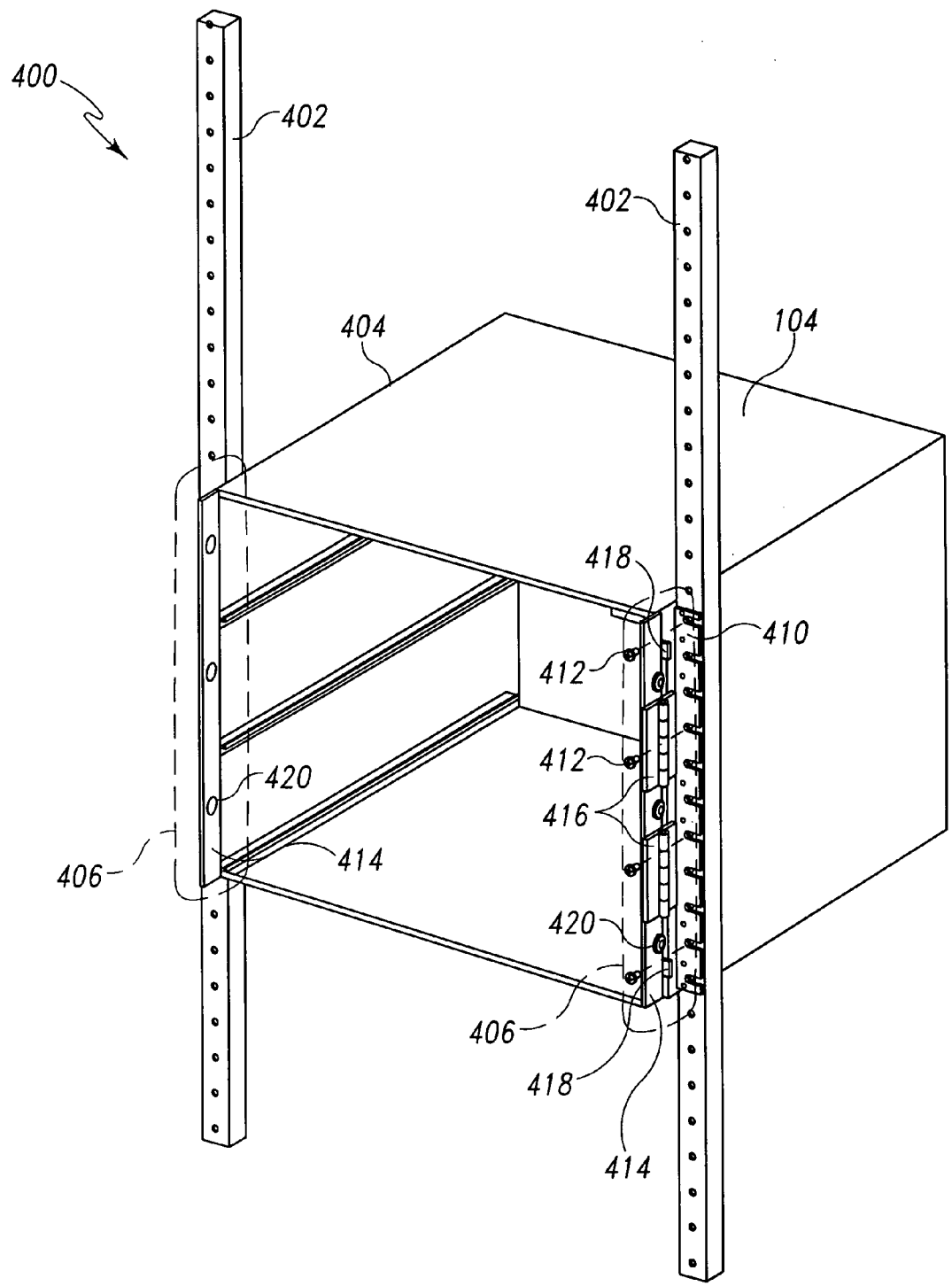
FIG. 4 is another isometric diagram of a mounted electronics system according to one embodiment of the present invention.

FIG. 4 is another isometric diagram of a mounted electronics system 400 according to one embodiment of the present invention. As shown in the example in FIG. 4, mounting assembly 406 is rotated toward the interior of chassis 404. While in this position, screws 412 are used to secure chassis 404 to frame 402 via bracket 410. Mounting assembly 406 includes flange 414, joints 416, stopper 418 and screw holes 420. As can be seen in FIG. 4, a mounting assembly 406 is included on each side of chassis 404. This provides substantially equal pressure on both sides of sub-modules secured to chassis 404. This pressure is particularly useful when sub-modules are coupled to connectors in the back of chassis 404 and need such pressure to maintain good connections. Notably, although mounting assembly 406 is shown extending substantially the entire height of chassis 404, the present invention is not intended to be so limited. For example, in another exemplary embodiment, mounting assembly 406 is divided into N smaller sections lined up along the height of chassis 404, each section extending along only a portion of the height of chassis 404.

Similarly, although two joints 416 are shown in the example embodiment in FIG. 4, the present invention is not intended to be so limited and any appropriate number of joints 416 is used in other embodiments. Joints 416 are implemented as hinges in FIG. 4. However, it is to be understood by one of skill in the art that, in other embodiments, other flexible joints are used, such as a ball-and-socket joint.

In operation, flange 414 of mounting assembly 406 is rotated about joint 416 toward the interior of chassis 404 in order to enable access to bracket 410 and frame 402. Bracket 410 and screws 412 secure chassis 404 to frame 402. Once chassis 404 is secured to frame 402, flange 414 rotates about joint 416 away from the interior of chassis 404 until it reaches stopper 418. Stopper 418 prevents flange 416 from rotating further and provides support maintaining flange 416 substantially parallel with and overlapping bracket 410 when sub-modules are secured to flange 416. Although two stoppers 418 are shown in FIG. 4, it is to be understood by one of skill in the art that any appropriate number of stoppers 418 is used in other embodiments. Sub-modules are then secured to flange 414. Securing sub-modules to flange 414 of mounting assembly 406 secures the sub-modules to chassis 404 without requiring use of interior space in chassis 404. Securing the sub-modules without using interior space in chassis 404 enables more interior space to be used for circuitry on the sub-modules and provides more front panel space for connectors and user interfaces.

Figure 5:
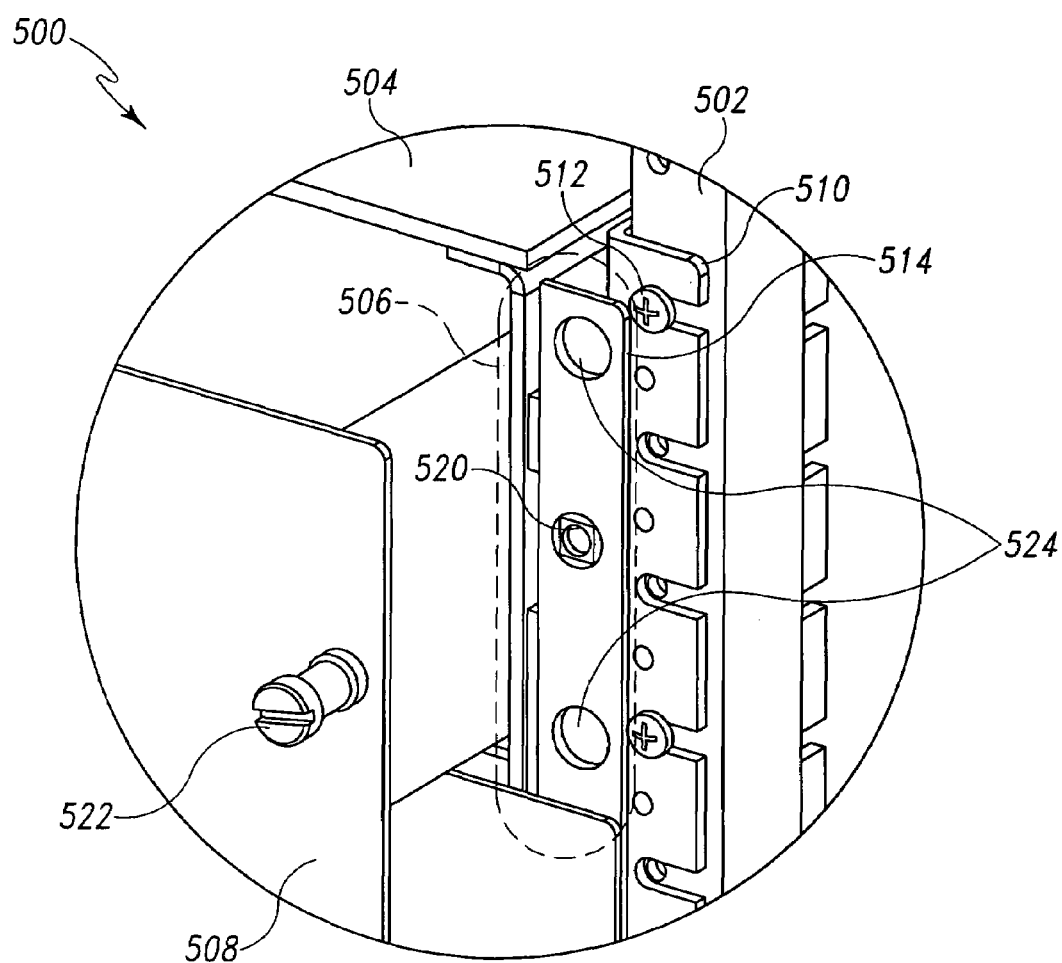
FIG. 5 is another enhanced view of a section of a mounted electronics system according to one embodiment of the present invention.

FIG. 5 is another close-up view of a section of a mounted electronics system 500 according to one embodiment of the present invention. As shown in FIG. 5, chassis 504 is secured to frame 502 via screws 512 and bracket 510. Similarly, sub-module 508 is secured to chassis 504 via screw 522 and screw hole 520 of mounting assembly 506. In this example embodiment, mounting assembly 506 is adapted with access holes 524. Access holes 524 enable access to screws 512 and bracket 510 even when flange 514 of mounting assembly 506 is overlapping bracket 510. Flange 514 is coupled to chassis 504 via at least one joint (such as joint 216 in FIG. 2). The at least one joint coupling flange 514 to chassis 504 is a flexible joint in some embodiments, such as a hinge and ball-and-socket joint. In other embodiments, the at least one joint coupling flange 514 to chassis 504 is a non-flexible joint. In fact, in some embodiments, flange 514 forms an integral part of one side of chassis 504. Even in embodiments with a non-flexible joint access to bracket 510 and screws 512 is still maintained via access holes 524. Hence, embodiments of mounting assembly 506 coupled to chassis 504 using a non-flexible joint still enable sub-module 508 to be secured to chassis 504 without requiring use of interior space in chassis 504.

In operation, screws 512 are inserted through access holes 524 in order to secure chassis 504 to frame 502 via bracket 510. Sub-module 508 is then inserted into chassis 504 and secured to chassis 504 using screw 522 and screw hole 520. Although only one screw 522 is shown in FIG. 5, it is to be understood that any appropriate number of screws 522 is used in other embodiments. Likewise, the number of screw holes 520 depends on the desired number of screws 522 to be used in securing sub-module 508 to chassis 504.

Figure 6:
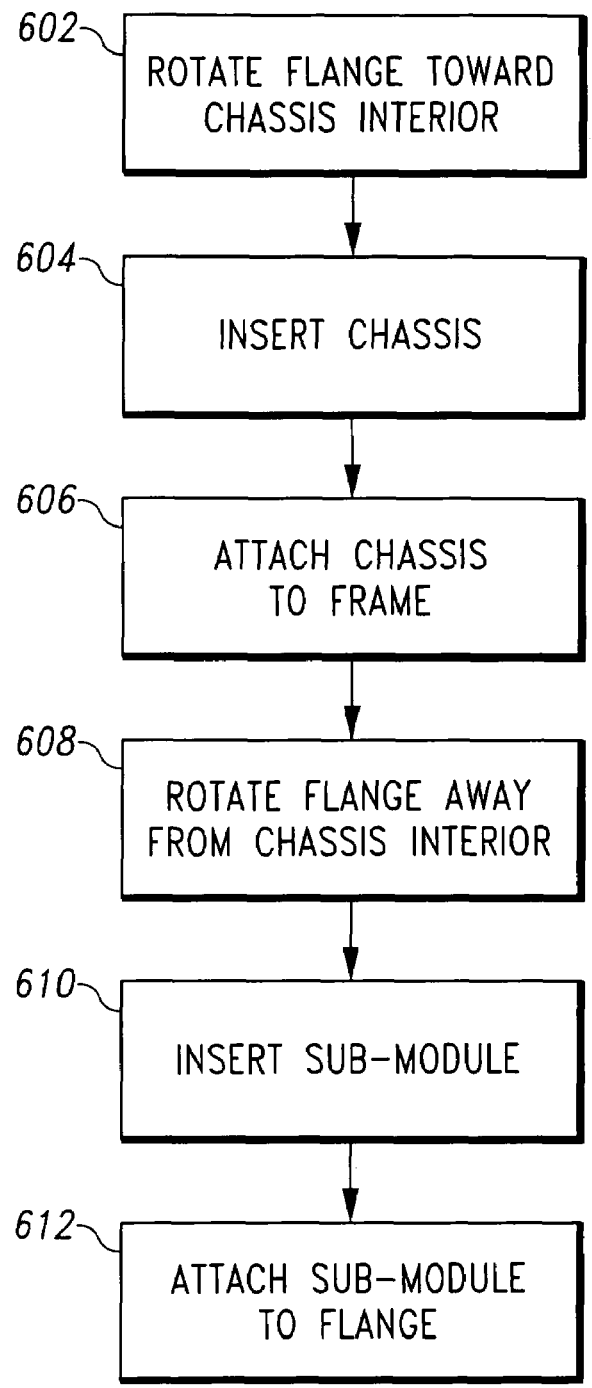
FIG. 6 is a flow chart showing a method of inserting a sub-module into a chassis according to one embodiment of the present invention.

FIG. 6 is a flow chart showing a method 600 of installing a sub-module into a chassis according to one embodiment of the present invention. At 602, a flange (e.g. flange 114) which is coupled to a chassis (e.g. chassis 104) via a joint (e.g. joint 116) is rotated about the joint toward the interior of the chassis. The flange is adapted with means for securing a sub-module to the flange. Such means include screws, clamps, and the like. The joint is adapted to be flexible enabling the flange to rotate about the joint. In one example embodiment, the joint is a hinge. In other embodiments, other flexible joints are used, such as a ball-and-socket joint. By rotating toward the interior of the chassis, the flange enables access to a bracket (e.g. bracket 110) for attaching the chassis to a frame (e.g. frame 102). At 604 the chassis is inserted into the frame. In this example embodiment, the frame is a 19-inch rack. However, in other embodiments, other frame structures are used, such as a 23-inch rack and 600 millimeter cabinet. At 606, the chassis is attached to the frame via the bracket. In this example embodiment, the chassis is attached with screws. However, it is to be understood that other means for attaching the chassis are used in other embodiments.

At 608, the flange is rotated away from the chassis interior. In this example embodiment, the flange is rotated until it is substantially parallel with and overlapping the bracket. However, in other embodiments, the flange is rotated to other positions away from the chassis interior. For example, in an alternative embodiment, the flange is rotated until it is substantially parallel with the chassis side to which the flange is attached. In any event, the flange is rotated such that it does not impede a sub-module (e.g. sub-module 108) from utilizing substantially the entire interior width of the chassis. Once the flange is rotated away from the interior of the chassis, the sub-module is inserted into the chassis at 610, occupying substantially the entire interior width of the chassis.

Once the sub-module is inserted into the chassis, the sub-module is attached to the flange at 612. In this example embodiment, a face of the sub-module is attached to the flange with at least one screw while the flange is substantially parallel with and overlapping the bracket. Although a screw is used in this embodiment to attach the sub-module to the flange, it is to be understood that other attaching means are used in other embodiments. In addition, in an alternative embodiment, the flange is substantially parallel with a side of the sub-module and chassis when the sub-module is attached to the flange. In yet another embodiment, the flange is again rotated toward the interior of the chassis until it overlaps and is substantially parallel with a face of the sub-module prior to attaching the sub-module to the flange. Attaching the sub-module to the flange secures the sub-module to the chassis. By providing rotation for the flange, embodiments of the present invention enable access to the bracket for mounting the chassis to a frame and enable use of sub-modules which occupy substantially the entire interior width of the chassis. The extra interior chassis space provided by embodiments of the present invention is an advantage for designers who are responsible for designing front panel access to the sub-module and for designing the components to fit within the confined special limitations of the chassis.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A mounted electronics system comprising:
   at least one sub-module;
   a chassis adapted to receive the at least one sub-module; and
   a mounting assembly coupled to the chassis and adapted to secure the at least one sub-module to the chassis such that substantially all of the interior width of the chassis is available for use by the at least one sub-module;
   wherein the mounting assembly comprises:
   a flange adapted to secure the at least one sub-module to the chassis; and
   at least one joint coupling the flange to the chassis, the at least one joint comprising a flexible joint adapted to enable the flange to rotate.

2. The mounted electronics system of claim 1, further comprising a frame to which the chassis is secured, wherein the frame comprises one of a 19-inch rack, a 23-inch rack, and a 600 millimeter cabinet.

3. The mounted electronics system of claim 1, wherein the flexible joint is further adapted to enable the flange to rotate towards the interior of the chassis when the chassis is secured to the frame and to rotate away from the interior of the chassis when the at least one sub-module is secured to the chassis.

4. The mounted electronics system of claim 1, wherein the at least one flexible joint is further adapted to enable the flange to rotate towards the interior of the chassis such that the flange is substantially parallel with and overlapping a face of the at least one sub-module when the at least one sub-module is secured to the chassis.

5. The mounted electronics system of claim 1, wherein the flexible joint further comprises at least one of a hinge and a ball-and-socket joint.

6. A chassis mounting assembly, comprising:
   at least one joint coupled to a chassis; and
   a flange coupled to the at least one joint and adapted to secure at least one sub-module to the chassis, wherein the flange is positioned such that substantially the entire interior width of the chassis is available for use by the at least one sub-module;
   wherein the at least one joint comprises a flexible joint adapted to enable the flange to rotate.

7. The chassis mounting assembly of claim 6, wherein the flexible joint is further adapted to enable the flange to rotate towards the interior of the chassis when the chassis is secured to the frame and to rotate away from the interior of the chassis when at least one sub-module is secured to the chassis.

8. The chassis mounting assembly of claim 6, wherein the at least one flexible joint is further adapted to enable the flange to rotate towards the interior of the chassis such that the flange is substantially parallel with and overlapping a face of the at least one sub-module when the at least one sub-module is secured to the chassis.

9. The chassis mounting assembly of claim 6, wherein the flexible joint further comprises at least one of a hinge and a ball-and-socket joint.

10. A mounted electronics system comprising:
    a frame;
    at least one sub-module;
    a chassis coupled to the frame and adapted to receive the at least one sub-module; and
    a mounting assembly coupled to the outside of the chassis, the mounting assembly comprising:
    a flange adapted to secure the at least one sub-module to the chassis; and
    at least one joint coupling the flange to the chassis, wherein the at least one joint is adapted to enable the flange to rotate such that the flange is able to rotate towards the interior of the chassis when the chassis is coupled to the frame and such that the flange is able to rotate away from the interior of the chassis when the at least one sub-module is secured to the chassis.

11. The mounted electronics system of claim 10, wherein the flexible joint further comprises at least one of a hinge and a ball-and-socket joint.

12. A mounted electronics system comprising:
    a frame;
    at least one sub-module;
    a chassis coupled to the frame and adapted to receive the at least one sub-module; and
    a mounting assembly coupled substantially to the outside of the chassis and adapted to secure the at least one sub-module to the chassis such that substantially all of the interior width of the chassis is available for use by the at least one sub-module, the mounting assembly comprising:
    a flange adapted to secure the at least one sub-module to the chassis; and
    at least one flexible joint coupling the flange to the chassis and adapted to enable the flange to rotate.

13. The mounted electronics system of claim 12, wherein the flange is further adapted with access holes such that screws securing the chassis to the frame are accessible through the access holes in the flange when the flange overlaps a portion of the frame.

14. The mounted electronics system of claim 12, wherein the at least one flexible joint is further adapted to enable the flange to rotate towards the interior of the chassis when the chassis is secured to the frame and to rotate away from the interior of the chassis when the at least one sub-module is secured to the chassis.

15. The mounted electronics system of claim 12, wherein the at least one flexible joint is further adapted to enable the flange to rotate towards the interior of the chassis such that the flange is substantially parallel with and overlapping a face of the at least one sub-module when the at least one sub-module is secured to the chassis.

16. The mounted electronics system of claim 12, wherein the at least one flexible joint further comprises at least one of a hinge and a ball-and-socket joint.

17. A chassis mounting assembly, comprising:
securing means for securing a sub-module to a chassis, wherein the securing means is located substantially outside of the chassis; and
rotating means, coupled to the securing means and chassis, for rotating the securing means such that the securing means is rotated towards the chassis interior when the chassis is secured to a frame and rotated away from the chassis interior when a sub-module is secured to a chassis via the securing means.

18. A method of inserting a sub-module into a chassis, the method comprising:
rotating a flange coupled to a chassis toward the chassis interior;
attaching the chassis to a frame;
rotating the flange away from the interior of the chassis, wherein the flange is rotated such that the flange does not prevent a sub-module from occupying substantially the entire interior width of the chassis;
inserting the sub-module into the chassis; and
attaching the sub-module to the flange.

19. The method of claim 18, wherein rotating the flange away from the interior of the chassis further comprises the step of rotating the flange away from the interior of the chassis until the flange is substantially parallel with and overlapping a bracket used to attach the chassis to the frame.

* * * * *